United States Patent
Gaertner et al.

(10) Patent No.: US 8,879,302 B2
(45) Date of Patent: Nov. 4, 2014

(54) MANAGEMENT OF VARIABLE RESISTANCE DATA STORAGE DEVICE

(71) Applicant: Seagate Technology LLC, Cupertino, CA (US)

(72) Inventors: Mark Allen Gaertner, Vadnais Heights, MN (US); Ryan James Goss, Prior Lake, MN (US); Jon D. Trantham, Chanhassen, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/777,760

(22) Filed: Feb. 26, 2013

(65) Prior Publication Data

US 2014/0241033 A1    Aug. 28, 2014

(51) Int. Cl.
*G11C 11/00* (2006.01)
*G11C 13/00* (2006.01)

(52) U.S. Cl.
CPC ........ *G11C 13/0002* (2013.01); *G11C 13/0004* (2013.01)
USPC ........ 365/148; 365/158; 365/94; 365/230.03; 365/227; 365/207; 257/390

(58) Field of Classification Search
CPC ........... G11C 13/0002; G11C 13/0004; G11C 2213/71; G11C 5/02
USPC .................................. 365/148, 189, 71, 191
See application file for complete search history.

(56) References Cited

U.S. PATENT DOCUMENTS

| | | | |
|---|---|---|---|
| 7,191,327 B2 | 3/2007 | Viljoen et al. | |
| 7,295,462 B2 | 11/2007 | Farnworth | |
| 7,506,335 B1 | 3/2009 | Wooff et al. | |
| 7,539,048 B2 | 5/2009 | Farnworth | |
| 7,797,525 B2 | 9/2010 | Lee et al. | |
| 7,873,059 B2 | 1/2011 | Morita et al. | |
| 8,027,207 B2 | 9/2011 | Fifield et al. | |
| 8,028,155 B1 | 9/2011 | Righi et al. | |
| 8,095,851 B2 | 1/2012 | Diggs et al. | |
| 8,159,869 B2 | 4/2012 | Park et al. | |
| 8,199,603 B2 | 6/2012 | Chung et al. | |
| 2003/0172135 A1 | 9/2003 | Bobick et al. | |
| 2009/0296452 A1* | 12/2009 | Tonomura | 365/148 |
| 2010/0023870 A1 | 1/2010 | Baker | |
| 2010/0027327 A1 | 2/2010 | Chung et al. | |
| 2010/0328995 A1* | 12/2010 | Shih et al. | 365/163 |
| 2011/0075473 A1 | 3/2011 | Park et al. | |
| 2011/0188292 A1 | 8/2011 | Joo et al. | |
| 2012/0230080 A1* | 9/2012 | Chang et al. | 365/148 |
| 2012/0260159 A1 | 10/2012 | Lazier et al. | |
| 2012/0284230 A1 | 11/2012 | Adkins et al. | |
| 2013/0212431 A1* | 8/2013 | Ong | 714/15 |

OTHER PUBLICATIONS

Lee, et al., "A fast, high-endurance and scalable non-volatile memory device made from asymmetric Ta2O5_x/TaO2_x bilayer structures,"Nature Materials, Jul. 10, 2011, pp. 1-6, DOI: 10.1038/NMAT3070; Macmillan Publishers Limited.

Zhang, et al., "Helmet: A Resistance Drive Resilient Architecture for Multi-level Cell Phase Change Memory System,"Intelligent Design of Efficient Architectures Laboratory (IDEAL), Department of Electrical and Computer Engineering, University of Florida.

* cited by examiner

*Primary Examiner* — Hoai V Ho
*Assistant Examiner* — Muhammad Islam
(74) *Attorney, Agent, or Firm* — Hall Estill Attorneys at Law

(57) ABSTRACT

Various embodiments may generally be directed to a variable resistance data storage device and a method of managing the device. A data storage device may have at least a controller configured to re-characterize at least one variable resistance memory cell in response to an identified variance from a predetermined resistance threshold.

20 Claims, 5 Drawing Sheets

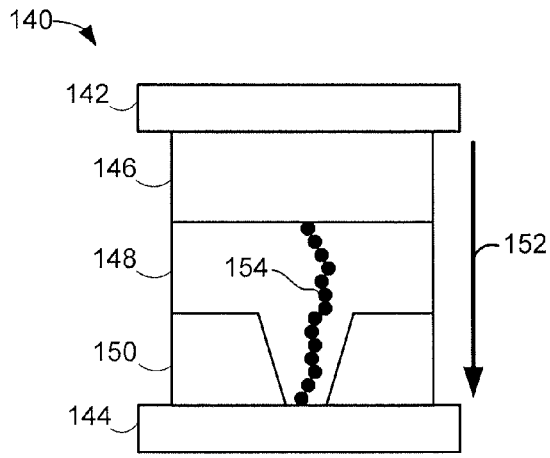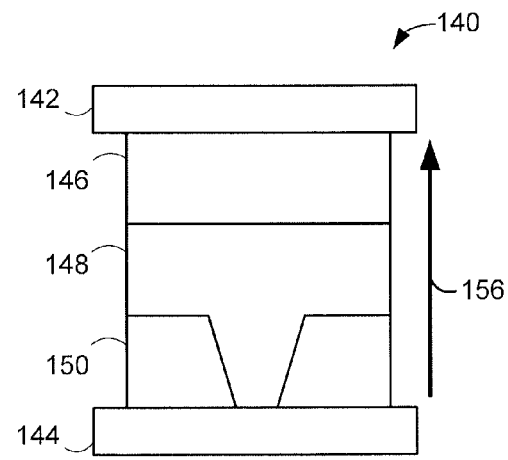
FIG. 3A  FIG. 3B
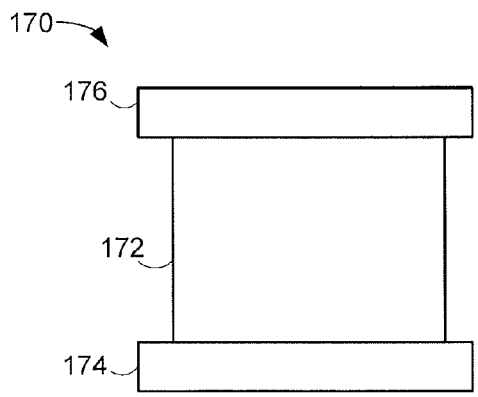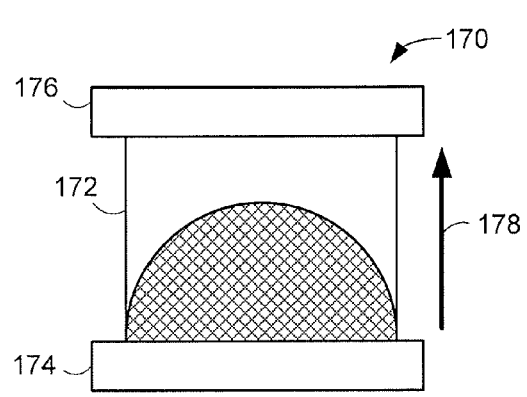
FIG. 4A  FIG. 4B
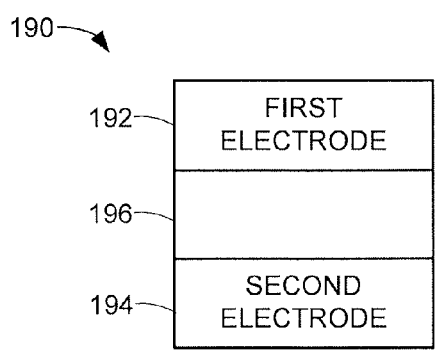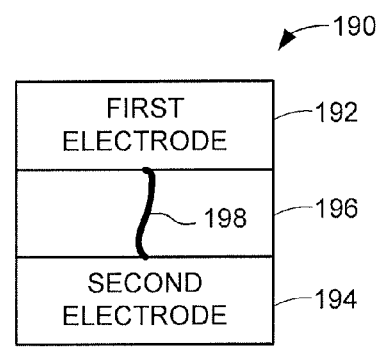
FIG. 5A  FIG. 5B

US 8,879,302 B2

MANAGEMENT OF VARIABLE RESISTANCE DATA STORAGE DEVICE

SUMMARY

Various embodiments may generally be directed to the management of a data storage device having variable resistance memory cells.

In accordance with some embodiments, a data storage device may have at least a controller configured to re-characterize at least one variable resistance memory cell in response to an identified variance from a predetermined resistance threshold.

BRIEF DESCRIPTION OF THE DRAWINGS

FIGS. 3A and 3B respectively show an example memory cell that may be utilized in the data storage device of FIG. 1.

FIGS. 4A and 4B respectively display an example memory cell capable of being utilized in the data storage device of FIG. 1.

FIGS. 5A and 5B respectively provide an example memory cell that is utilized in a data storage device in various embodiments.

DETAILED DESCRIPTION

An increased emphasis on the form factor, storage capacity, and access speeds of data storage devices has stressed various material and operational characteristics of rotating data media environments, such as accurate magnetic shielding in heightened data bit density storage devices. While some or all of a data storage device can comprise solid-state memory cells that occupy less room and can be accessed faster than data bits on a rotating media, a myriad of manufacturing and operational conditions can exist for solid-state memory cells that threaten data integrity and access speeds.

One such condition may be resistance variations in memory cells that store data as different resistance states. The deviation of resistance from predetermined thresholds can lead to increased data errors and data access times as memory cells are repeatedly read without confirmation of a stored logic state. While the testing of solid-state memory cells may mitigate the presence of resistance variations, such testing can be costly in terms of processing overhead and temporary memory cell deactivation. Hence, there is a continued industry goal associated with more efficiently testing and handling memory cell operational deviations like resistance variations.

Accordingly, various embodiments can be generally directed to magnetic storage devices constructed with at least a controller configured to re-characterize at least one variable resistance memory cell in response to an identified variance from a predetermined resistance threshold. The identification of a predetermined resistance threshold may be conducted in proactive or reactive manners that allow for optimized use of a storage device's processing capacities without impinging on data access reliability or speed. The ability to re-characterize a variable resistance memory cell based on the proactive and reactive identification of resistance variance can provide sustained performance despite the presence of memory cells with deviated operational characteristics.

Figure 1:
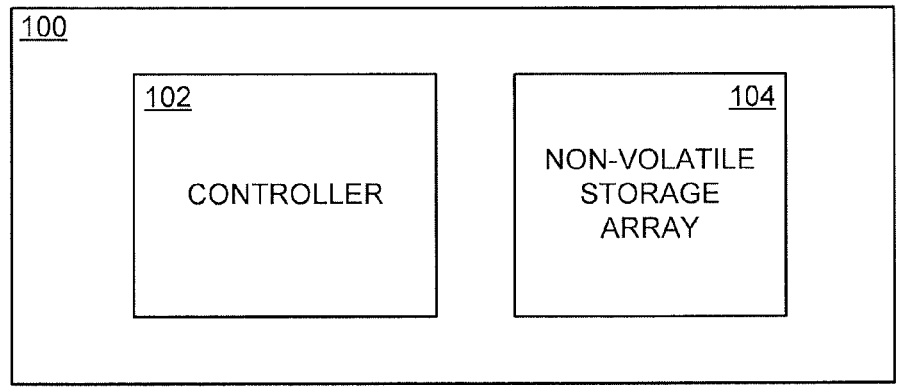
FIG. 1 provides a block representation of a data storage device constructed and operated in accordance with various embodiments.

A variable resistance solid-state memory cell may be utilized and re-characterized in a variety of non-limiting data storage environments. FIG. 1 provides a block representation of an example data storage device 100 in which various embodiments can be practiced. The device 100, which in some embodiments is configured as a solid-state drive (SSD), has a top level controller 102 and a non-volatile data storage array 104 that may be connected via an unlimited variety of electrical interconnections like wiring, interfaces, busses, and multiplexers. The controller 102 can be used to facilitate the transfer of user data between the storage array 104 and a host device that is internal or external to the storage device 100.

In some embodiments, the controller 102 is a programmable microcontroller that can buffer data in at least one interface circuit pending a transfer between the array 104 and the host device. The position of the controller 102 and storage array 104 are not limited to the concurrent presence illustrated in FIG. 1 as any part of the storage device 100 element may be physically or logically absent while concurrently controlling various operational aspects of the storage device 100. That is, the physical presence of the controller 102 and storage array 104 are not required as either element can be positioned external to the storage device 100, such as across a network accessed with appropriate protocol, while facilitating scheduled and non-scheduled operations within the storage array 104. Similarly, additional external controllers and storage arrays may be present internally or externally to the storage device 100 to be selectively utilized, as scheduled and desired.

Figure 2:
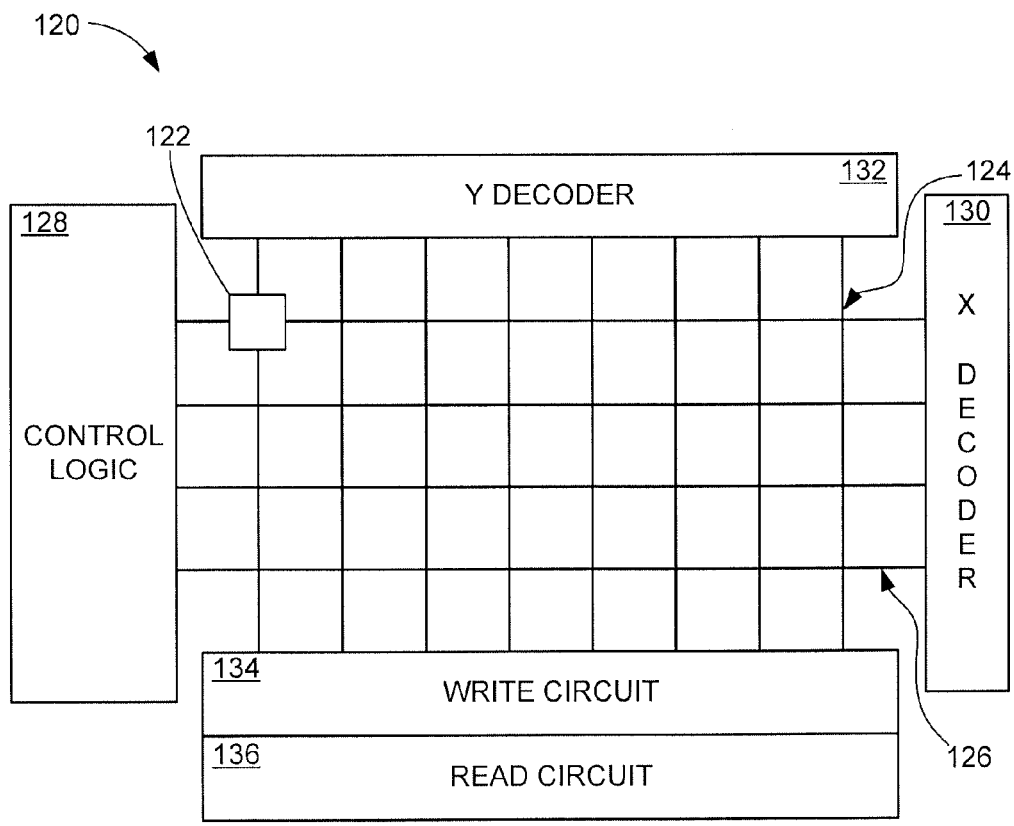
FIG. 2 shows a block representation of a portion of the memory array capable of being used in the data storage device of FIG. 1.

FIG. 2 generally illustrates a block representation of a portion of an example non-volatile storage array 120 that may be used in a data storage device like the device 100 in FIG. 1. A number of non-volatile memory cells 122 are arranged in rows and columns that correspond with the overlapping of electrical paths 124 and 126, such as bit and source lines, in an orientation that can be characterized as a cross-point array. Control logic 128 can individually or concurrently control data being written to and read from selected memory cells 122 arranged in sectors, pages, blocks, and garbage collection units. Such control may be conducted with respect to multiple cells, such as an entire row, page, and block, to expedite data accesses.

A plurality of memory cells 122 are coupled via control lines 126 to an X (row) decoder 130 and via control lines 124 to a Y (column) decoder 132. A write circuit 134 operates to carry out write and erase operations with the memory cells 122 and a read circuit 136 operates to carry out read operations with a predetermined number of the memory cells 122 either individually or collectively. The control logic 128 can be configured, in some embodiments, to provide reference parameters, such as voltages, resistances, and pulse widths, that are catered to more than one type of solid-state memory cell. In other words, different sections of memory, such as different pages or blocks of memory, can be configured physically and logically with different types of memory cells that each operate to store data, but correspond with different reference parameters that are provided by the control logic 128 to accurately translate a read or write output into a logic state.

FIGS. 3A and 3B illustrate an example programmable metallization cell (PMC) element 140 that may be used exclusively or concurrently with other types of memory in the data storage array of FIGS. 1 and 2. The PMC element 140 may be formed with top 142 and bottom 144 electrodes, a metal layer 146, an electrolyte layer 148 and a dielectric layer 150. Control circuitry, such as the control logic 128 of FIG. 2, can be used to adjust the relative voltage potential between the first 142 and second 144 electrodes, resulting in passage of a write current 152 through the PMC element 140 to form a filament 154 that changes the resistance of the cell from a high resistance to a low resistance that can correspond to a first predetermined logic state, such as 1.

The filament 154 establishes an electrically conductive path between the metal layer 146 and the bottom electrode 144 by the migration of ions from the metal layer 166 and electrons from the bottom electrode 144. The dielectric layer 150 focuses a small area of electron migration from the bottom electrode 144 in order to control the position of the resulting filament 154. Subsequent application of a write current 156 in a second direction, as shown in FIG. 3B, through the PMC element 140 causes migration of the ions and electrons back to the respective electrodes 142 and 144 to resets the PMC element 140 to its initial high electrical resistance that corresponds with a different second predetermined logic state, such as 0. PMC elements with a construction similar to that shown at 140 can alternatively be programmed using unipolar programming currents of different magnitudes and/or pulse widths that are selectively provided by control circuitry like the control logic 128 of FIG. 2.

Another non-exclusive type of solid state memory capable of being used in a data storage array in accordance with various embodiments is provided by the example phase change random access memory (PCRAM) element 170 displayed in FIGS. 4A and 4B. FIG. 4A shows the phase change element 170 with a phase change layer 172 disposed between top 174 and bottom 176 electrodes. While not required or limiting, the phase change layer 172 can be formed of a polycrystalline chalcogenide material of group VI of the periodic table, such as Tellurium (Te) and Selenium (Se) while in some embodiments, the phase change layer 172 is formed of $Ge_2Sb_2Te_5$ (GST) or In—Ge—Te.

As shown in the differences between FIGS. 4A and 4B, the phase change layer 172 can be programmed to transition between crystallized and amorphous phases in response to joule heating caused by the passage of a suitable current 178 through the element 170. To place the layer 172 into a relatively high resistance amorphous phase, a fairly high voltage potential is applied across the electrodes 174 and 176 to heat the layer 172 above its melting temperature. The voltage is removed rapidly so as to provide a relatively sharp cooling transition, which may be referred to as a quenching process. In such case, the atoms may not have sufficient time to relax and fully array into a crystalline lattice structure, thereby ending in a metastable amorphous phase and high resistance, as depicted in FIG. 4B.

The layer 172 is placed into a relatively low resistance crystalline phase by applying a write current of relatively lower and longer duration. The applied pulse is configured to raise the temperature of the layer so as to be above its glass transition temperature and below its melting temperature, and to gradually decrease in temperature back to ambient level. Such temperature gradient will generally provide sufficient dwell time for the material to crystallize, as depicted in FIG. 4A. With the programming operation of the PCRAM element 170, data writing currents to place the layer 172 in the respective amorphous and crystalline phases can both be applied in a common direction (uniform polarity) 178, which may provide optimized data programming performance in some data storage arrays.

FIGS. 5A and 5B provide another example solid-state memory element in the form of a resistive random access memory (RRAM) element 190 that can be utilized singularly or plural in a data storage array in accordance with various embodiments. The RRAM element 190 has opposing metal or metal alloy electrode layers 192 and 194 that are separated by an intervening oxide layer 196. A first, higher resistance programmed state, as displayed by FIG. 5A, is established by the nominal electrical resistance of the oxide layer 196. Application of a suitable write voltage potential and/or write current in a selected direction across the element 190 can induce metal migration from the electrode layer 192 and the formation of one or more electrically conductive metallization filaments 198 through the oxide layer 196, as shown in FIG. 5B.

In some embodiments, the oxide layer 196 is configured as a lamination of different materials that can mitigate leakage current and lower programming current. As a non-limiting example, asymmetric $TaO_{2-x}$ and $Ta_2O_{5-x}$ can be have different thicknesses and form the oxide lamination. Such asymmetric oxide lamination can exhibit optimized endurance, data retention, and access speed that is scalable and can be access in a transistorless and diodeless cross-point array, such as the array 120 of FIG. 2.

Various embodiments may also use other resistive memory types, such as nanotube random access memory (NRAM), that employs a non-woven matrix of carbon nanotubes that are moved by Van Der Waal's forces to form high and low resistive states. The size and scalability of NRAM allows the memory to be used in a variety of different memory array applications like a switching device and memory cell. The low access currents associated with reading data from and writing data to further allows NRAM to be utilized individually or in combination with other resistive memory types to provide diverse data storage capabilities for a data storage device.

Such filaments generally operate to lower the characteristic resistance of the element 190 and provide different high and low resistance states that can correspond to different logic states. To return the programmed state of the element 190 to the high resistance state of FIG. 5A, an appropriate write voltage potential and/or current is applied between the electrodes 192 and 194 in a direction that rescinds the filament 198. The creation and subsequent removal of the filament 198 can be less than 10 ns with a 30 μA or less writing current, which may optimize data storage array performance by being implemented alone or in combination with other types of solid-state memory and assigned to operating conditions, such as user data, metadata, and spare cells, that maximize the element's 190 relatively fast programming time and low programming current.

Figure 6:
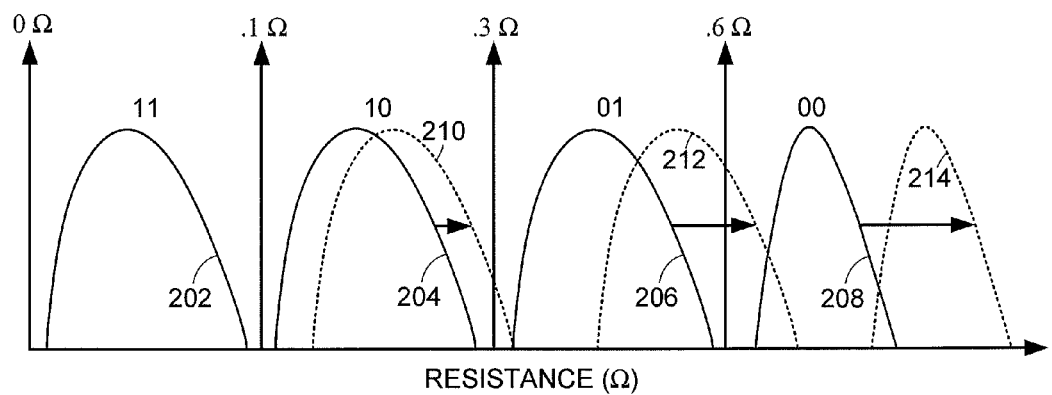
FIG. 6 graphically represents a number of programmed state distributions for an example memory cell.

FIG. 6 plots operational data from an example solid-state memory cell being utilized in a data storage array in accordance with some embodiments. The various resistance regions 202, 204, 206, and 208 respectively correspond to the resistance distributions for a plurality of memory cells programmed to logical values 11, 10, 01, and 00 in a multi-level cell (MLC) configuration. This may be contrasted to a single level cell (SLC) configuration that stores a single bit as either a logical value 0 or 1. Generally, bits can be represented by 2n logical bit values, as illustrated in FIG. 6.

While a number of different logical value designations may be utilized without restriction, a logical value convention in accordance with various embodiments assigns a logical value of 11 to the lowest resistance and logical values of 10, 01, and 00 to progressively higher resistances. Regardless of the logical value designations, various memory cell operations can contribute to an inadvertent shift in the resistance of a solid-state memory cell, as displayed by segmented regions 210, 212, and 214. For example but in no way limiting, the number of successive programming cycles of increasing and decreasing the stored resistance of a memory cell, the time a high resistance state has been continually stored in a memory cell, the temperature of a data storage array, and the amount of programming current used to program a memory cell can all contribute to an increase, or decrease, in stable resistance states for a single bit or multi-bit memory cell.

A solid-state memory cell, such as the elements 140, 170, and 190 of FIGS. 3A, 4A, and 5A, can be constructed with materials, layer thicknesses, and overall dimensions conducive to repeatedly providing a plurality of distinct resistances based on a programming current. With the unwanted shift in the stored resistance ranges as illustrated by regions 210, 212, and 214 extending across logical state thresholds, such as 0.3Ω and 0.6Ω, logical value accuracy can be tainted as a logical state like 01 can be read as a different state, like 00. Resistance shift may further be exacerbated by attempting to differentiate between stored logical states during a concurrent reading of a page or block of memory cells that contain numerous separate resistances, some of which may have varying degrees of resistance shift.

Figure 7:
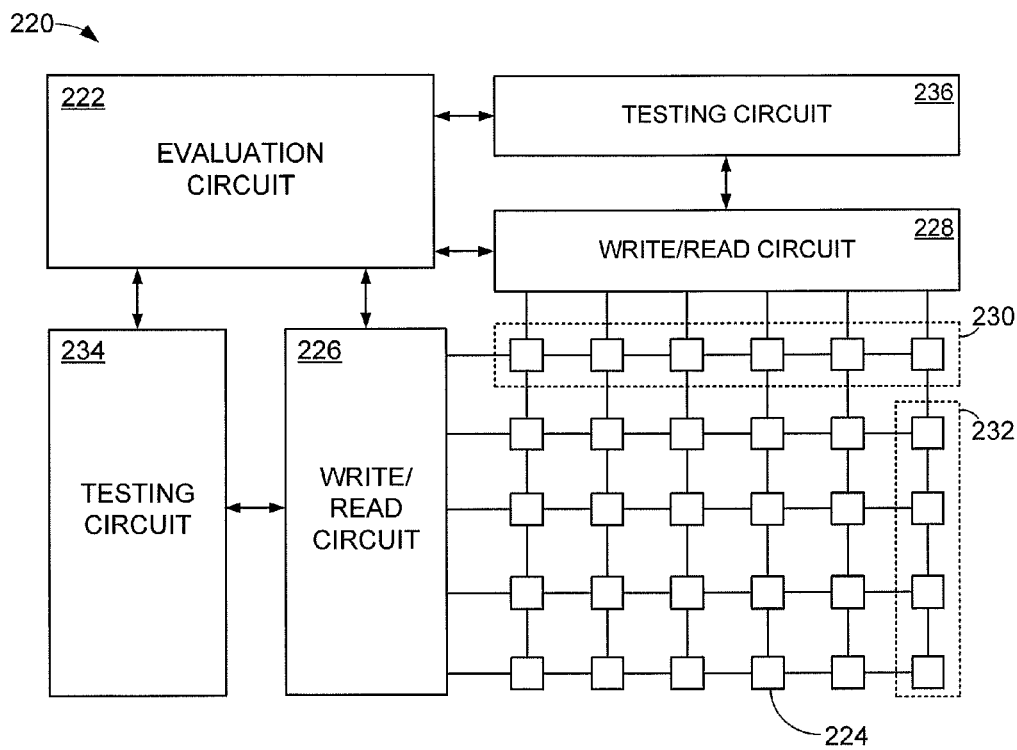
FIG. 7 is a block representation of an example control circuitry portion of a data storage device constructed in accordance with some embodiments.

As the cause for resistance shift is not yet fully understood, prevention of resistance shift has not been reliable. Accordingly, various embodiments are directed to reactive and proactive adaptation to memory cell resistance shift identified through testing, observation, and evaluation across a wired or wireless network with appropriate protocol like testing and prediction circuitry. FIG. 7 illustrates a block representation of a portion of an example data storage device 220 having an evaluation circuit 222 capable of concurrently and successively testing and logging operational parameters of one or more memory cells 224. As shown, the memory cells 224 can be physically arranged in rows and columns that are logically arranged as sectors and blocks capable of simultaneous data reading, writing, and rewriting via row 226 and column 228 write/read circuits.

In a non-limiting example operation, the write/read circuits 226 and 228 may concurrently provide access to a page 230 or unit 232 of memory cells for scheduled or unscheduled user and overhead system operations. One or more testing circuits 234 and 236 may provide row and column testing capabilities that are monitored, recorded, and evaluated by the evaluation circuit 222. The testing circuits 234 and 236 can be configured to place one or more memory cells 224 and pages 230 of memory in predetermined states, such as in a common logical and resistance value, that may or may not be online for user access in a testing mode characterized by passage of one or more quiescent current through the selected memory cells 224 to identify and differentiate one or more different types of cell defects, operating parameters, and types of memory. In other words, a single memory cell 224, or more cells concurrently or successively, may be taken offline and set to a testing mode by the testing circuits 234 and 236 to allow a plurality of testing currents to be passed through the cell(s) 224 to determine a variety of biographical, operational, and defective characteristics that are logged and evaluated in the evaluation circuit 222.

As such, the evaluation circuit 222 may direct operation of the testing circuits 234 and 236 as well as write/read 226 and 228 circuits to determine what and how memory cells 224 are operating in the data storage device 220. In some embodiments, the evaluation circuit 222 conducts evaluation and testing of some or all of the memory cells 224 prior to user data ever being written, which can provide baseline data that can be utilized later. Various embodiments further can periodically and sporadically conduct tests and evaluations of the operating characteristics of various memory cells 224. Such periodic testing may be conducted during predetermined and emergency times, such as low system processing and idle times, to identify various operational conditions like the resistance shift illustrated in FIG. 6.

With the ability to test various memory cells 224 and groups of cells 232, the evaluation circuit 222 can adapt to identify static and dynamic variations in memory cell performance. However, the use of system resources to test and evaluate memory cell performance can be costly in terms of system resources, especially in mobile devices dependent on limited battery life. Also, the reactive nature of corrections to memory cell 224 variances may not be conducted soon enough to ensure high data reliability and access speeds. Thus, the evaluation circuit 222 may be configured with a variety of capabilities to allow for the predictive adaptation of memory cells 224 to identified and imminent variances.

Figure 8:
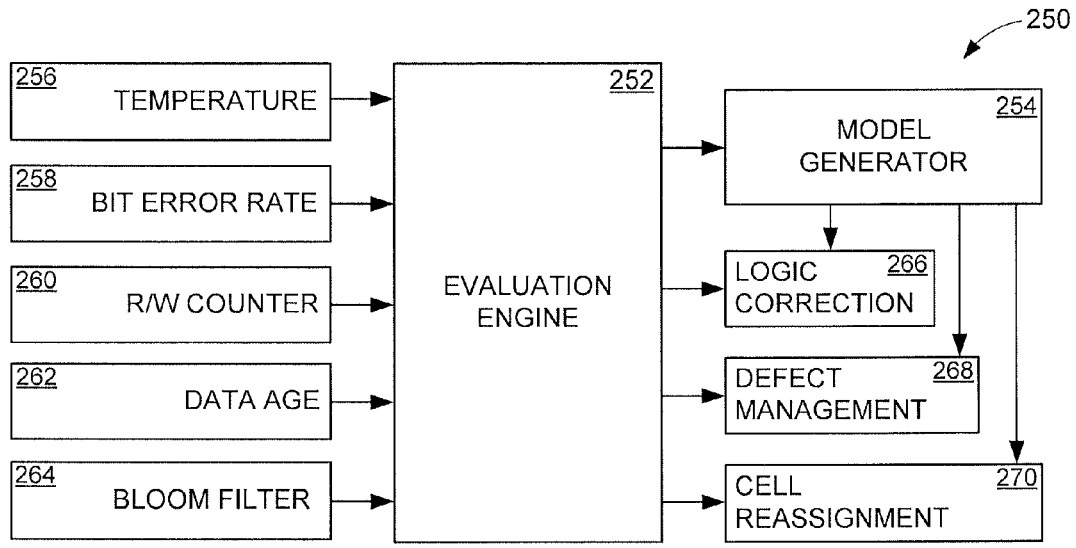
FIG. 8 shows a block representation of example control circuitry operated in accordance with various embodiments.

FIG. 8 provides a block representation of a proactive portion 250 of an example data storage device configured and operated in accordance with various embodiments. An evaluation engine 252 may be separate, like across a network via appropriate protocol, or integrated within an evaluation circuit like the circuit 222 of FIG. 7. Regardless of where the engine 252 is located, a plurality of different types of data may be separately recorded and evaluated by the engine 252 to be passed to a model generator 254 that can process the data and identify probable and imminent memory cell variations, such as resistance, logic state, and access time variations. For example but not limiting, sensors, processing circuits, and timers can provide at least temperature 256, bit error rate 258, read/write counter 260, data age 262, and bloom filter 264 conditions to the evaluation engine 252 for a diverse map of how a data storage array is performing.

One or more temperature sensors 256 can continually and sporadically measure the ambient air temperature of a data storage device as well as the localized temperature of a memory cell, page of memory, and die of memory pages. That is, the air temperature of a device can concurrently or successively lead to the monitoring of individual memory regions to detect particularly hot, or cold, locations. In some embodiments, a threshold temperature, such as 150° F., is set and triggers the investigation of a particular portion of a memory array once the threshold is surpassed. Such investigation may involve taking one or more memory cells offline for testing and predictively changing logic state resistances of cells exposed to temperatures outside a predetermined range. An investigation may result in additional increments may be provided to the read count for one or more memory cells.

A bit error rate (BER) 258 for one or more memory cells may also be monitored by the evaluation engine 252 to predict the physical and logical probability of memory cells that are operating outside of predetermined parameters, like data reliability. For example, a high bit error rate for a memory cell may trigger further investigation or adjustment of cells physically adjacent the identified call as well as cells logically connected to the identified cell via consecutive data accesses. The bit error rate may be monitored in tiers of memory, such as by blocks and pages, which can result in more efficient analysis as higher BER in higher tiers can subsequently correspond with analysis of fewer cells in lower memory tiers.

Various sectors, pages, blocks, and dies of memory can be continually monitored over an extended time, such as over the life to the data storage device, and for shorter times, such as during the previous hour and week, to provide a read/write counter 260 of the number of data accesses to the evaluation engine 252. Some types of memory and operational conditions, like PCRAM cells being accessed heavily, may be prone to resistance shift, which can be predicted and compensated for in advance. The counter 260 can, in some embodiments, log a multitude of data accesses, like the number of reads, writes, and rewrites, as well as the amount of current being passed through the memory cells to provide data to the evaluation engine 252 and model generator 254 with information on how the various memory cells are being accessed.

While counters may monitor accesses to one or more memory cells, an age counter 262 can operate to record the overall amount of time that has passed since a memory cell was written, read, and changed. Through various environmental and operational memory cell conditions, such as read disturb and undiscovered localized heating and trauma, the relocation of data can proactively improve the accuracy of data storage. The age counter 262 can be complemented by the measured and estimated bit error rate 258 and read/write counter 260 to provide a comprehensive memory cell map that allows the evaluation engine 252 and model generator 254 to create long-range and precise operational models predicting when and which memory cells will deviate from predetermined operational thresholds like resistance states.

A bloom filter 264 can be used to provide a weighted factor approach to track the data from the temperature 256, read/write counter 260, and data age counter 262 and provide the evaluation engine 252 with data that can efficiently be utilized by the model generator 254 to construct memory cell operational predictions. In some embodiments, a weighted factoring may provide an adjusted read count such as:

$$\text{Count(Adj)} = \text{Actual Reads} + K1(\text{Temp}) + K2(\text{Age}) + K3(\text{Delta-V}) \quad (1)$$

where Count(Adj) is an adjusted count value, Actual Reads represents an actual read operation, Temp is a temperature reading/range/zone, Age represents aging of the block, and Delta-V represents detected or predicted changes in cell resistance during a data access operation. Aging can be tracked in a variety of ways with module 262, such as in relation to a total number of writes and/or reads upon the selected memory location. The delta-V value can be utilized responsive to the application of different read voltage and resistance thresholds. It will be appreciated that other factors may be used.

The creation of accurate operation models via the model generator 254 can allow for an unlimited variety of proactive measures to be taken to optimize data storage device performance. First, one or more memory cells can undergo logic correction 266 where the threshold resistances and voltages separating logical value states are adjusted to prevent overlapping of measured memory cell resistance into two different logic states, as shown by segmented regions 210 and 212 of FIG. 4. The logic correction may be conducted on single and multiple memory cells concurrently and successively with a test pattern of data subsequently written to the cells and verified to ensure the re-characterized resistance values are accurate and repeatable.

A memory cell may further be re-characterized by assigning a defective moniker to the cell, page of cells, block of pages, and die of blocks as part of defect management 268. Being labeled as defective can correspond with a myriad of non-limiting actions, none of which are required. Such actions may include at least taking a memory cell offline permanently, repairing the cell, and replacing the cell with an unused spare cell depending on the location, type of use, frequency of use, and cell status. As an example, a defective memory cell could be taken offline and repaired via a high current pulse and subsequently returned to online status if the repair works or the cell could be replaced with a spare cell if the repair fails to restore repeatable cell function. Defect management 268 may, through tested identification of defects by the evaluation engine 252 and predicted identification of defects via the model generator 254, entail the correction of various error correction codes (ECC) and metadata associated with one or more defective memory cells.

Regardless of whether a memory cell has undergone logic correction 266 and/or defect management 268, the cell may be re-characterized through cell reassignment 270 to optimize cell operation despite previous deviation from resistance thresholds. A cell reassignment 270 can, for instance, transition a cell from a multi-level cell to a single level cell as higher resistances become unreliable. A cell can be also transitioned through cell reassignment 270 from a high data access activity location and use in a data array, such as a low level memory metadata utility, to a low data access activity location, like long-term user data storage. Various embodiments may further reassign memory cells between sectors and pages of memory to logically alter the type and number of data accesses that will likely be conducted, as predicted by the model generator 254.

The diversity of memory cell re-characterizations that can be made either as the result of testing from the evaluation engine 252 or as the result of predictive modeling from the model generator 254 can allow for reactive and proactive memory array optimization. Such optimization may involve providing individual memory cells and pages of memory with references parameters that result in accurate data reading and rewriting.

Figure 9:
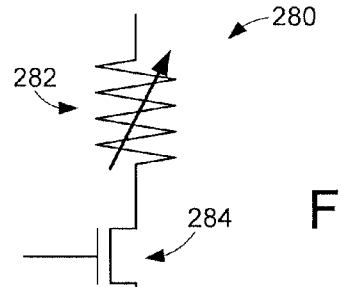
FIG. 9 provides a schematic depiction of an example memory cell read in accordance with some embodiments.

FIG. 9 provides a schematic view of an example solid-state memory cell 280 portion of a data storage device. The memory cell 280 is shown comprising a memory element 282, such as a RRAM element, connected in series with a switching element 284, such as a transistor or diode. Reading of the memory element 282 can be accomplished through selection of the switching element 284 and passage of a reading current through the memory element 282 and a sense amplifier 286. The sense amplifier 286 further inputs a reference voltage 288 that allows the sense amplifier 286 to indicate the logic state 290 of the memory cell 280. In addition to the reactive and proactive actions of the evaluation engine and model generator, tuning the reference voltage 288 can provide a tool to optimize memory cell performance, particularly cell reading accuracy.

Figure 10:
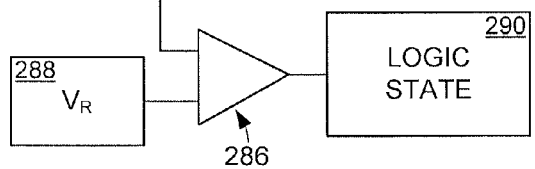
FIG. 10 displays a block representation of a portion of an example data storage device constructed and operated in accordance with various embodiments.
Figure 10:
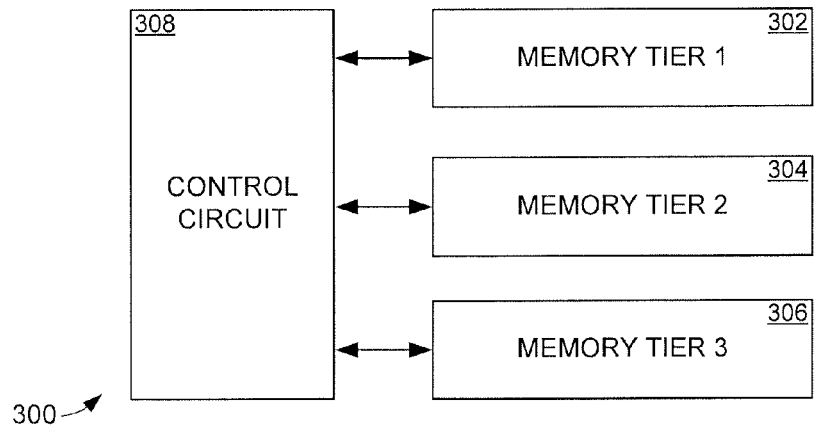

FIG. 10 displays a block representation of an example control portion 300 of a data storage device capable of being integrated with the proactive and reactive determinations of an evaluation engine and model generator. The control portion 300 has a plurality of different memory tiers 302, 304, and 306 that are individually and collectively operated through control circuitry 308. In various embodiments, the various memory tiers correspond with different memory cell types like RRAM, PCRAM, and PCM, but similar memory cell functions, such as metadata and storage of user data, which the control circuitry 308 selectively utilizes to optimize data storage performance. For instance, data initially stored in the first memory tier 302 that is constructed as phase change memory cells can be moved for redundancy or relocation to RRAM memory cells of the second memory tier 304.

The ability to control the type of solid-state memory cell data is to be stored in further provides sophistication and precision to reactive and proactive memory array adaptations to memory cell deviations, such as cell reassignment and logic correction. However, it should be noted that the use of different types of memory cells may additionally provide cells with different resistances, reading, and writing profiles that correspond with differing tests and predictive models that are concurrently managed by evaluation and control circuitry to maximize the adaptability of a memory array to variances in cell resistances.

Figure 11:
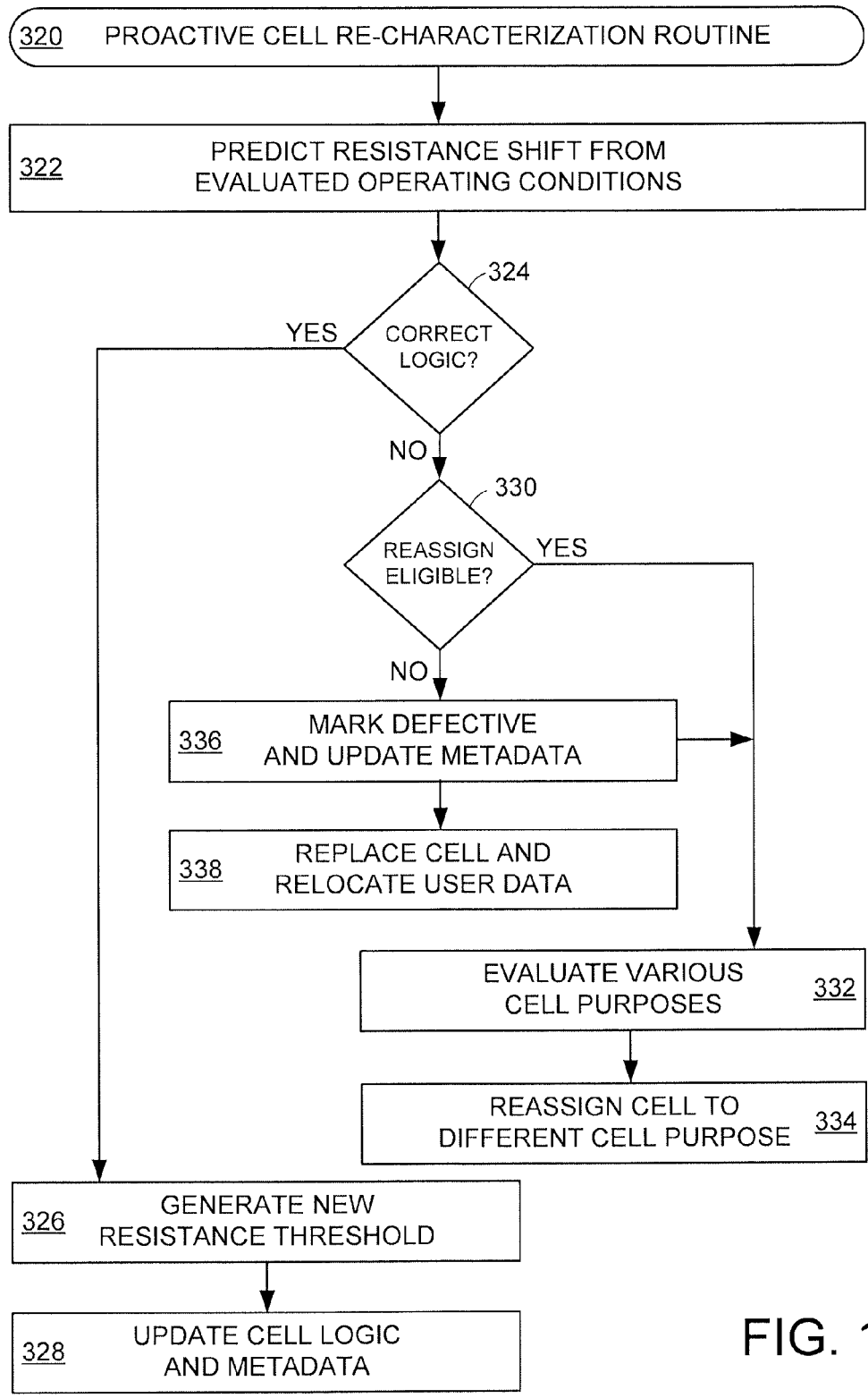
FIG. 11 illustrates an example proactive memory cell management routine carried out in accordance with some embodiments.

FIG. 11 provides a logical map of an example cell re-characterization routine 320 carried out in accordance with some embodiments. The prediction of a resistance shift based on evaluated operating conditions in step 322 can initially correspond with a variety of processed data, such as temperature, bit error rate, and data access counters, that have undergone evaluation and modeling. Step 322 may involve the evaluation of logged operational and testing data concerning one or more memory cells to identify future deviations in resistance for cells that currently have not deviated from predetermined resistance thresholds. Such identification can be based on past evaluations and tests of defective cells or may be based on identified trends that suggest cell deviation from predetermined threshold. The ability to continually log operational data from memory cells that have been previously re-characterized can progressively enhance the accuracy of prediction models and the efficiency of adapting to deviations in variable resistance memory cells.

A predicted resistance shift from step 322 can proceed to decision 324 where a determination is made whether or not to conduct logic correction on the one or more memory cells predicted to deviate from a predetermined resistance range. Step 326 generates new resistance threshold for one or more memory cells according to predetermined tables and observed operational data that may be produced by the evaluation engine and model generator. The newly generated resistance thresholds between two or more logic states, such as in a multi-bit memory cell, are stored in the metadata and cell logic corresponding to the memory cell in step 328. The updating of memory cell operational data, like ECC, resistance thresholds, and forward pointers, can be stored collectively in a look-up table as well as in overhead cells like biographical metadata cells.

Either at the conclusion of step 328 or if no logic correction is chosen in decision 324, decision 330 assesses whether or not to reassign a deviated memory cell to a different physical location, logical location, cell type, use, or activity level. Step 332 follows decision 330 if a cell is to be reassigned and evaluates various cell purposes based on the tested or projected resistance thresholds after the resistance shift. At least one of the cell purposes can then be assigned in step 334 and subsequently correspond with updating of the cell overhead, like metadata and ECC, that allows the cell to fully function in its new purpose.

The result of a memory cell deviating from predetermined resistance thresholds, regardless of whether the cell had previously undergone logic correction or been reassigned, advances routine 320 to step 336 where the cell is marked defective and metadata is updated to direct control logic to another available cell. Step 336 may temporarily or permanently take the defective cell offline to attempt repair or reassignment through steps 332 and 334 with the eventual reactivation of the cell without the defective moniker. In the event the cell cannot be reassigned or repaired or repair has failed, step 338 replaces the defective cell with a spare bit and relocates any data, such as user data, to the spare bit.

Through the various steps and decisions of routine 320, a data storage device can proactively identify and correct for deviations from predetermined resistance thresholds based on tested and observed operating conditions. However, routine 320 is not limited to the steps and decisions provided in FIG. 11 as an unlimited variety of steps and processes may be changed, omitted, and added, at will. As a non-limiting example, a step can be included that successfully repairs a memory cell after step 336 and subsequently reassigns the cell with step 334 and undergoes logic correction with steps 326 and 328 to become a fully functioning memory cell adapted from a previously experienced deviation.

The broad range of testing and predictive abilities provided by the evaluation and modeling circuitry described herein allow for continual optimization of a data storage array in accordance with the foregoing description. The proactive adjustment of memory cells based on tested and observed operational conditions can be conducted at opportune times that maximize system efficiency while reducing data access errors and prolonging the operational lifespan of the cells. Moreover, the ability to utilize a multitude of different memory types can optimize memory cell and array performance by allowing memory cells to be assigned and have logic states characterized according to the operational advantages of each memory type.

It is to be appreciated that the claimed technology can readily be utilized in any number of applications, including network and mobile data storage environments. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed.

What is claimed is:

1. An apparatus comprising a controller configured to re-characterize at least one variable resistance memory cell in response to an identified variance from a predetermined resistance threshold, the controller comprising an evaluation engine configured to concurrently analyze a plurality of different memory cell operational conditions to reactively identify variance from the predetermined resistance threshold.

2. The apparatus of claim 1, wherein the at least one variable resistance memory cell is part of a solid-state memory array.

3. The apparatus of claim 2, wherein the solid-state memory array has a plurality of different types of variable resistance memory cells.

4. The apparatus of claim 3, wherein a first type of variable resistance memory cell comprises a programmable metallization cell.

5. The apparatus of claim 4, wherein a second type of variable resistance memory cell comprises a phase change random access memory cell.

6. The apparatus of claim 5, wherein a third type of variable resistance memory cell comprises a resistive random access memory cell.

7. The apparatus of claim 1, wherein the at least one variable resistance memory cell is re-characterized from a multi-level cell (MLC) having a multi-bit logic configuration to a single level cell (SLC) having a single bit logic configuration.

8. The apparatus of claim 1, wherein the evaluation engine provides a model generator with data to proactively identify variance from the predetermined resistance threshold.

9. The apparatus of claim 8, wherein the identified variance from the predetermined resistance threshold corresponds with the at least one variable resistance memory cell complying with the predetermined resistance threshold.

10. A method comprising identifying variance from a predetermined resistance threshold in at least one variable resistance memory cell and re-characterizing the at least one variable resistance memory cell in response to the identified variance from a predetermined resistance threshold, wherein the at least one variable resistance memory cell is re-characterized by assigning a defective moniker to the cell by taking the cell offline and replacing the cell with a spare memory cell comprising a different type of variable resistance memory.

11. The method of claim 10, wherein the at least one variable resistance memory cell is re-characterized by altering the predetermined resistance threshold.

12. The method of claim 10, wherein the at least one variable resistance memory cell is re-characterized using an evaluation engine configured to concurrently analyze a plurality of different memory cell operational conditions to reactively identify variance from the predetermined resistance threshold.

13. The method of claim 10, wherein the at least one variable resistance memory cell is re-characterized from a multi-bit logic configuration to a a single bit logic configuration.

14. The method of claim 12, wherein the spare memory cell comprises a different type of variable resistance memory cell.

15. A method comprising identifying variance from a predetermined resistance threshold in at least one variable resistance memory cell and re-characterizing the at least one variable resistance memory cell in response to the identified variance from a predetermined resistance threshold, the variance identified using an evaluation engine which concurrently analyzes a plurality of different memory cell operational conditions to reactively identify variance from the predetermined resistance threshold.

16. The method of claim 15, wherein the at least one variable resistance memory cell is re-characterized by altering the predetermined resistance threshold before actual variance from the predetermined resistance threshold.

17. The method of claim 15, wherein the re-characterizing of the at least one variable resistance memory cell comprises altering a logical address of the at least one variable resistance memory cell.

18. The method of claim 15, wherein the re-characterizing of the at least one variable resistance memory cell comprises converting said memory cell from a multi-level cell (MLC) having a multi-bit logical configuration to a single level cell (SLC) having a single bit logical configuration.

19. The method of claim 15, wherein the evaluation engine provides a model generator with data to proactively identify variance from the predetermined resistance threshold.

20. The method of claim 15, wherein the identified variance from the predetermined resistance threshold corresponds with the at least one variable resistance memory cell complying with the predetermined resistance threshold.

* * * * *